(12) United States Patent
Skinner et al.

(10) Patent No.: US 6,613,240 B2
(45) Date of Patent: Sep. 2, 2003

(54) METHOD AND APPARATUS FOR SMOOTHING THIN CONDUCTIVE FILMS BY GAS CLUSTER ION BEAM

(75) Inventors: Wesley J. Skinner, Andover, MA (US); Allen R. Kirkpatrick, Lexington, MA (US)

(73) Assignee: Epion Corporation, Billerica, MA (US)

( * ) Notice: Subject to any disclaimer, the term of this patent is extended or adjusted under 35 U.S.C. 154(b) by 0 days.

(21) Appl. No.: 09/727,881

(22) Filed: Dec. 1, 2000

(65) Prior Publication Data

US 2002/0068132 A1 Jun. 6, 2002

Related U.S. Application Data

(60) Provisional application No. 60/169,342, filed on Dec. 6, 1999.

(51) Int. Cl.[7] .......................... B44C 1/22; C23C 16/00; C23C 14/34; B05D 1/40
(52) U.S. Cl. ...................... 216/38; 118/723 CB; 427/9; 427/331; 204/192.11; 204/192.34; 204/298.04
(58) Field of Search ................ 204/298.04, 298.03, 204/298.06, 298.23, 298.32, 298.34, 298.36, 192.11, 192.33, 192.34; 216/38; 427/9, 331; 118/723 CB (56) References Cited

U.S. PATENT DOCUMENTS

| 4,217,855 A | 8/1980 | Takagi .................. 118/719 |
| 4,361,762 A | 11/1982 | Douglas ................ 250/251 |
| 4,639,301 A | * 1/1987 | Doherty et al. ........ 204/192.31 |
| 4,740,267 A | 4/1988 | Knauer et al. .......... 156/635 |
| 5,110,435 A | * 5/1992 | Haberland ............. 204/192.31 |
| 5,206,590 A | 4/1993 | Dieny et al. ............ 324/252 |
| 5,459,326 A | 10/1995 | Yamada ................ 250/398 |
| 5,648,885 A | 7/1997 | Nishioka et al. ......... 360/11.3 |
| 5,814,194 A | 9/1998 | Deguchi et al. ........ 204/192.1 |
| 5,825,595 A | 10/1998 | Gill ..................... 360/113 |
| 5,849,422 A | 12/1998 | Hayashi ............... 428/611 |
| 6,331,227 B1 | 12/2001 | Dykstra et al. ......... 156/345.1 |

FOREIGN PATENT DOCUMENTS

| JP | 59-73241 | 10/1985 | ........ C23C/14/22 |
| JP | 60-87866 | 11/1986 | ........ H01L/21/31 |
| JP | 04045264 A | 2/1992 | ........ C23C/14/32 |
| JP | 05132767 A | 5/1993 | ........ C23C/14/32 |

OTHER PUBLICATIONS

A. Wallash & Young K. Kim, "Magnetic Changes in GMR Heads Caused by Electrostatic Discharge", IEEE Transactions on Magnetics, vol. 34., No. 4, pp. 1519–1521, Jul. 1998.

Albert J. Wallash & Young K. Kim, "Electrostatic discharge sensitivity of giant magnetoresistive recording heads", J. Appl. Phys. 81 (8), pp. 4921–4923, Apr. 15, 1997.

Z. Insepov, J. Yamada & M. Sosnowski, "Sputtering and smoothing of metal surface with energetic gas cluster beams", Materials Chemistry and Physics 54 (1998), pp. 234–237.

(List continued on next page.)

Primary Examiner—Steven H. VerSteeg
(74) Attorney, Agent, or Firm—Perkins, Smith & Cohen, LLP; Jerry Cohen; Jacob N. Erlich (57) ABSTRACT

A method and apparatus is disclosed that provided for the successful and precise smoothing of conductive films on insulating films or substrates. The smoothing technique provides a smooth surface that is substantially free of scratches. By supplying a source of electrons, harmful charging of the films and damage to the films are avoided.

22 Claims, 10 Drawing Sheets

OTHER PUBLICATIONS

Isao Yamada & Jiro Matsuo, "Cluster ion beam processing", Materials Science in Semiconductor Processing 1 (1988), pp. 27–41.

Robert L. White, "Giant Magnetoresistance: A Primer", IEEE Transactions on Magnetics, vol. 28, No. 5, Sep. 1992, pp. 2482–2487.

J.C.S. Kools & W. Kula, "Effect of finite magnetic film thickness on Neel coupling in spin valves", Journal of Applied Physics, vol. 85, No. 8, Apr. 15, 1999, pp. 4466–4468.

R. Schad, et al., "Influence of different kinds of interface roughness on the giant magnetoresistance in Fe/Cr superlattices", Journal of Magnetism and Magnetic Materials 156, 1996), pp. 339–340.

J. Ben Youssef, et al., "Correlation of GMR with texture and interfacial roughness in optimized rf sputtering deposited Co/Cu multilayers", Journal of Magnetism and Magnetic Materials 165 (1997), pp. 288–291.

Y.Z. Hu, et al., "Chemical–mechanical polishing as an enabling technology for giant magnetoresistance devices", Thin Solid Films 308–309 (1997), pp. 555–561.

G. Choe & M. Steinback, "Surface roughness effects on magnetoresistive and magnetic properties of NiFe thin films", Journal of Applied Physics, vol. 85, No. 8, Apr. 15, 1999, pp. 5777–5779.

* cited by examiner

METHOD AND APPARATUS FOR SMOOTHING THIN CONDUCTIVE FILMS BY GAS CLUSTER ION BEAM

CROSS REFERENCE TO RELATED APPLICATIONS

This application claims priority of the U.S. Provisional Application Ser. No. 60/169,342 filed Dec. 6, 1999 entitled A SYSTEM FOR SMOOTHING THIN CONDUCTIVE FILMS BY GCIB.

BACKGROUND OF THE INVENTION

This invention relates generally to the smoothing of conductive films, and, more particularly to the smoothing of thin conductive films by GCIB.

Thin film magnetic sensors based on magnetoresistance (MR) effects have come to play an important role in the implementation of high data-density read sensors for hard disk drive magnetic information storage technology. Such devices are often referred to as MR read heads. They are typically capable of reading data stored at higher densities than was possible with inductive read heads. MR sensors detect information bits stored as magnetic field changes by responding with a change in resistance dependent on the sensed magnetic field and field direction.

It is known (see for example R. White, "Giant Magnetoresistance: A Primer", *IEEE Trans Magnetics,* 28(5) (September 1992), p 2482–87) that improved sensors based on a giant magnetoresistance (GMR) effect can be more sensitive than basic MR sensors by employing a "spin valve" (SV) configuration which exploits the quantum nature of electrons (two allowed spin directions—up and down). In such devices, electrons with a spin direction aligned with a ferromagnetic material's magnetic orientation move through the material freely, while those with a spin direction opposite that of the material's magnetic orientation undergo more frequent collisions with atom of the material and experience higher electrical resistivity. Various SV designs have been developed to optimize the sensitivity and noise levels to achieve denser read head capabilities. Such devices are fabricated as a series of stacked thin films of selected materials having selected properties and deposited on a substrate material. One figure of merit of a SV is the GMR ratio ($\Delta R/R$), the percentage resistance change for a predetermined change in the magnitude or direction of an external magnetic field. A higher GMR ratio means that the device is a more sensitive transducer.

The most elementary SV designs comprise two thin ferromagnetic films of differing magnetic orientation separated by a thin third, conductive but non-magnetic, layer. For best performance, the ferromagnetic films and the interface film must be quite thin—on the order of the mean free path of the electrons, several tenths of nm to tens of nm (several Angstroms to hundreds of Angstroms). In one of the two ferromagnetic layers, the magnetic field direction is held fixed (pinned) in orientation. In the other ferromagnetic layer, the field is initially of different orientation from that of the pinned layer, but is free to change orientation in response to an external magnetic influence. When the free layer is brought into magnetic alignment with the pinned layer by the influence of an external magnetic field, there results a change in electrical resistivity of the system, which permits transduction of the magnetic change into an electrical change.

There are two commonly employed methods of pinning the magnetic orientation of one of the layers. In one approach, an additional layer of antiferromagnetic material is located adjacent to the layer to be pinned. In the other method, the two ferromagnetic layers are fabricated of materials having differing coercivities, that of the pinned layer being substantially higher than that of the free layer so that the magnetic orientation of the pinned layer is not influenced by the external field, but that of the free layer is. In both approaches, the devices are normally constructed on a planar substrate using thin film deposition techniques and planar processing techniques that are generally well known in the industry.

The substrate is frequently an insulating material like glass or ceramic or is a conductive material, such as silicon, having a dielectric surface film, such as $SiO_2$. One role of the insulating film or substrate is to assure that the substrate conductivity is low enough to avoid an undesirable electrical shunting effect on the magnetoresistive layers.

For hard disk drive heads it is often common practice to fabricate a SV read head in close juxtaposition with a thin film inductive write head.

The GMR ratios of fabricated devices.are dependent on many parameters including the materials and the thicknesses of the layers. From published information, it is also known that the GMR ratios of SV and other GMR devices benefit from having a controlled smoothness and flatness of the magnetic and interface layer surfaces (see for examples, Choe and Steinback in "Surface roughness effects on magnetoresistive and magnetic properties of NiFe thin films, *J. Appl. Phys.,* 85(8) (1999), pp 5777–9 and Kools et. al. in "Effect of finite magnetic film thickness on Néel coupling in spin valves", *J. Appl. Phys.,* 85(8) (1999), pp 4466–8). Thus it is necessary to control, among other parameters, the thickness, smoothness, and flatness of the films. This is also true for other types of GMR effect devices, examples being given by Schad et.al. in "Influence of different kinds of interface roughness on the giant magnetoresistance in Fe/Cr superlattices", *J. Mag. & Mag. Matls.,* 156 (1996), pp 339–40, as well as by Ben Youssef et. al. in "Correlation of GMR with texture and interfacial roughness in optimized rf sputtering deposited Co/Cu multilayers", *J. Mag. & Mag. Matls.,* 165 (1997), pp 288–91.

For this reason, during the fabrication of GMR devices, it has been the practice to employ chemical-mechanical polishing techniques for smoothing and planarizing the surfaces of various layers following their deposition (see Hu et. al. in "Chemical-mechanical polishing as an enabling technology for giant magnetoresistance devices", *Thin Solid Films,* 308–309 (1997), pp 555–561).

However, CMP has not been entirely satisfactory because the degree of smoothness required to achieve maximum performance of GMR devices is often beyond the capabilities of standard CMP processes since surface roughness on the order of a few Angstroms or less may be detrimental. Also, because CMP uses an abrasive slurry, it often leaves microscopic scratches in the polished surface.

It is therefore an object of this invention to facilitate the successful and precise smoothing of conductive films on insulating films or substrates.

It is a further object of this invention to provide a m smoothing of conductive films that is free of scratches.

It is a still further object of this invention to provide a m smoothing of conductive films that avoids damage to the magnetic and insulating films.

It is an even further object of this invention to provide a smoothing of conductive films that produces an ultra-smooth surface on a film of desired final thickness.

SUMMARY OF THE INVENTION

The objects set forth above as well as further and other objects and advantages of the present invention are achieved by the embodiments of the invention described hereinbelow.

The present invention facilitates the successful and precise smoothing of conductive films on insulating films or substrates. The system of this invention provides smoothing for metal films that is superior to prior chemical-mechanical polishing techniques and therefore results in a smoother surface that is substantially free of scratches. By supplying a source of low energy electrons, harmful charging of the films and damage to the magnetic and insulating films are avoided. Further characterizing the smoothing/thinning process in the present invention for a predetermined GCIB condition and using that characterization to determine an initial over-thickness of the starting film enables this process to produce a result that yields an ultra-smooth surface of desired final thickness.

For a better understanding of the present invention, together with other and further objects thereof, reference is made to the accompanying drawings and detailed description.

DETAILED DESCRIPTION OF THE PREFERRED EMBODIMENTS

Figure 1:
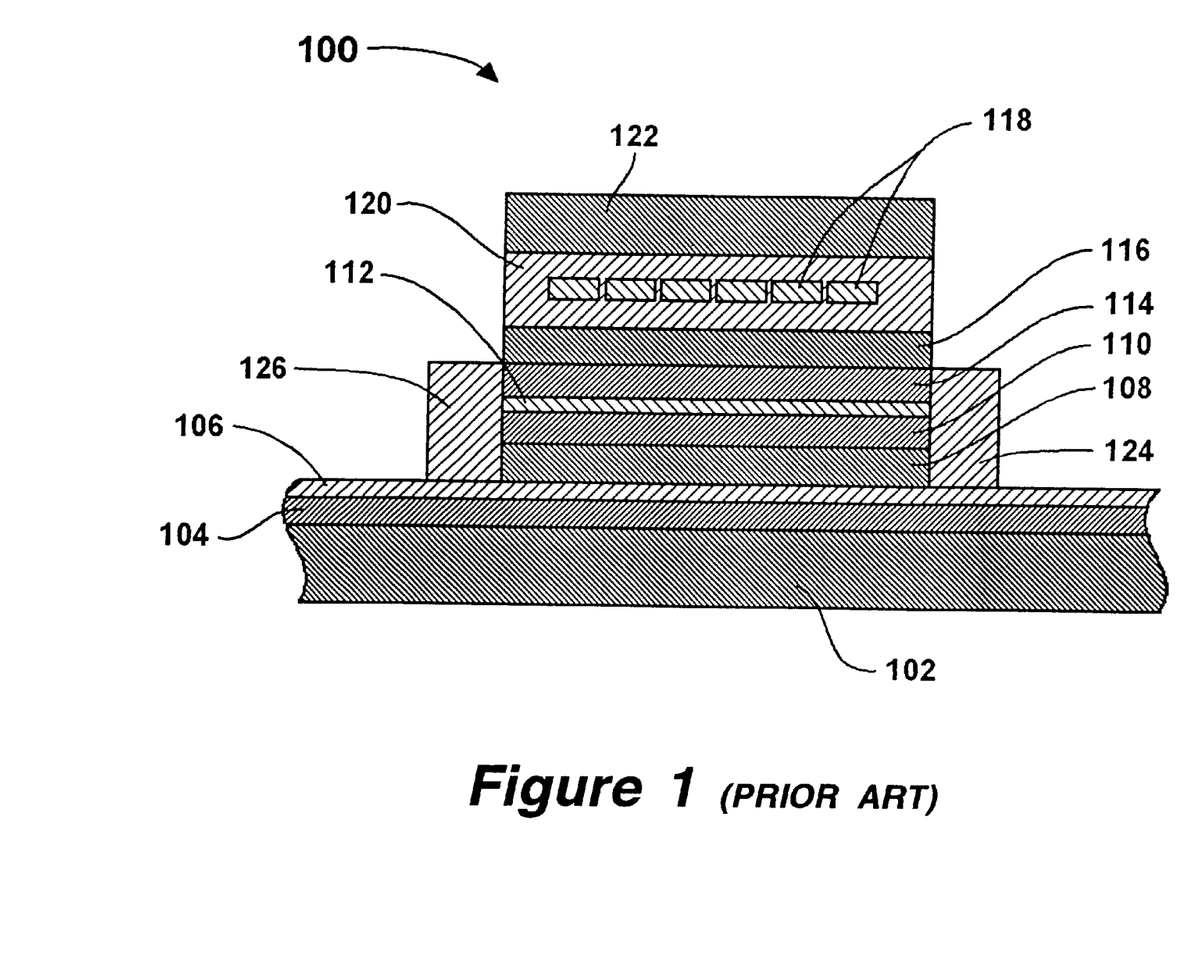
FIG. 1 is an explanatory sectional side view of one possible configuration (not to scale) of a prior art magnetic data storage combined read/write head having a Spin Valve magnetoresistive device employed in the read portion.

To better understand the present invention, reference is first made to FIG. 1 which shows an explanatory sectional side view 100 of one possible layering structure for a prior art read/write head employing a MR spin valve sensor as the reading element. In FIG. 1, the substrate 102 is a suitable supportive material (for example, silicon, glass, ceramic, metal) and may be electrically insulating, conducting, or semi-conducting. The SV is comprised of layers 108,110, 112, and 114 along with electrical leads 124 and 126. A lower shield layer 104 and an upper shield layer 116 provide magnetic isolation for the MR spin valve sensor and may be, for example, a NiFe alloy such as Permalloy. Isolation layer 106, for example $Al_2O_3$ or $SiO_2$, is typically an insulating dielectric to avoid electrical shunting of the spin valve by the lower layers. Anti-ferromagnetic layer 108 comprises an anti-ferromagnetic material (for example FeMn) provided to pin the magnetic orientation of the pinned magnetoresistive layer 110. Interface layer 112 is an electrically conductive but nonmagnetic (for example, copper) layer. A free magnetoresistive layer 114 can change magnetic orientation in response to an external magnetic field. Layers 110 and 114 may be for example, a NiFe alloy such as Permalloy. Upper shield layer 116, write coil 118, write coil dielectric 120, and upper write pole 122 comprise the inductive write head. In this example, for economy, upper shield layer 116 of the spin valve serves both as the upper shield of the magnetoresistive spin valve sensor of the read head and also as the lower write pole for the write head. The upper shield layer/lower write pole 116 and upper write pole 122 are both magnetic materials, for example NiFe alloy such as Permalloy. The write coil 118 is an electrically conductive inductive coil for producing magnetic write signals in the upper and lower write poles. An insulating write coil dielectric 120 layer provides inter-metal insulation for the write coil 118 and electrical isolation for the write coil 118 from the write poles 116 and 122. Not shown are leads for carrying the electrical writing signals to the write coil.

It is readily appreciated that there are many possible arrangements of layers for realizing MR sensors for read heads for magnetic storage technology with hard disk drives or for other storage media. Examples are shown in Dieny et. al., U.S. Pat. No. 5,206,590 and in Gill, U.S. Pat. No. 5,825,595 as well as in Hayashi, U.S. Pat. No. 5,849,422. It is also appreciated that many different materials may be suitable for the fabrication of the layers and the substrates, some of which have been taught by Hayashi in U.S. Pat. No. 5,849,422. It is further appreciated that the film thicknesses may be diverse, though in general the thicknesses of MR and GMR sensing films and the interface films often fallin the range of from 1 to 30 nm. In addition to spin valves, other structures exploiting MR and GMR effects have been employed including multi-layer sensors, some are taught in Nishioka et.al. in U.S. Pat. No. 5,648,885. The important feature, for purposes of this present invention, of all of these many possible arrangements is that the thin electrically conductive magnetic films are deposited on insulating substrates or on conductive or semi-conductive substrates containing an insulating dielectric layer.

Figure 2:
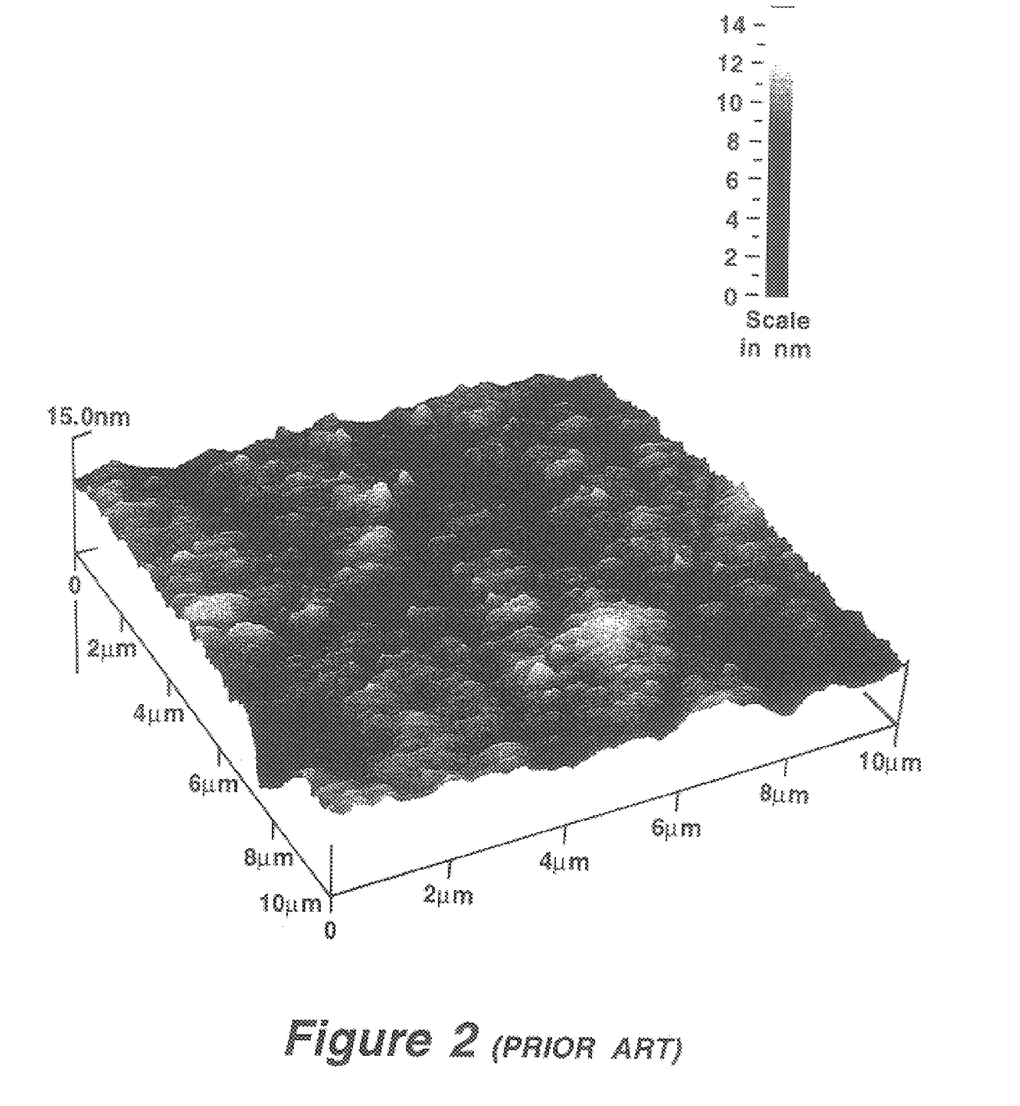
FIG. 2 is an atomic force micrograph of a Permalloy surface after CMP smoothing.

FIG. 2 shows an atomic force microscope micrograph of a 10 microns square region of the surface of a Permalloy film polished by prior art CMP techniques. Note the undesirable residual roughness and the presence of undesirable scratches resulting from the presence of sub-micron sized grit present in the polishing slurry. The surface roughness of the Permalloy surface shown in FIG. 2 has an average roughness, $R_a$, measured to be approximately 6.9 Angstroms, and has a root-mean-square roughness, $R_{rms}$, of approximately 9.3 Angstroms. As subsequent films are deposited on such a surface, a cumulative effect can result in magnification of surface roughness defects. Such roughness and accumulation of roughness and small-scale waviness can result in reduced GMR ratios in devices. It is important to be able to provide very smooth films at many stages of fabrication of the stack of films that comprise a GMR device. In the GMR device itself (for example a spin valve), roughness or waviness of the films contribute directly to loss of sensitivity (GMR ratio) of the transducer. On the other hand, roughness or waviness of surfaces deposited prior to deposition of the GMR device (for example layers 102, 104, and 106 in FIG. 1) also contribute to cumulative roughness or waviness in the films deposited later including the films of the GMR device. Thus in order to prevent cumulative effects from degrading the sensitivity of the transducer, it is sometimes necessary to smooth the layers deposited prior to the actual fabrication of the GMR device.

Because of the detrimental side effects caused by charging, gas cluster ion beams have not previously been successfully applied to fabrication of GMR devices. However, the use of a gas cluster ion beam (GCIB) for etching, cleaning, and smoothing of material surfaces is known in the art (see for example Deguchi et al. in U.S. Pat. No. 5,814,194). For purposes of this discussion, gas clusters are nano-sized aggregates of materials that are gaseous under conditions of standard temperature and pressure. Such clusters typically consist of aggregates of ~10 to ~several thousand atoms or molecules loosely bound to form the cluster. Such clusters can be ionized by electron bombardment or other means, permitting them to be formed into directed beams of known and controllable energy. Because ionized clusters consisting of on the order of hundreds or thousands of gas atoms or molecules may be formed and accelerated to modest energies on the order of a few thousands of electron volts, individual atoms or molecules in the clusters each only have an average energy on the order of a fraction of an electron volt to several electron volts. Thus, it is known that such atoms in a cluster are not individually energetic enough to significantly penetrate a surface to cause the residual surface damage typically associated with prior art ion beam processing in which individual atoms may have energies on the order of thousands of electron volts. Nevertheless, the clusters themselves can be made sufficiently energetic (some thousands of electron volts), to effectively etch, smooth or clean surfaces.

One aspect of the invention is recognizing that accelerated gas cluster ions striking a surface undergo an inelastic collision process which effectively sputters the surface layers with minimal effect on the deeper subsurface. Sputtering by ionized gas clusters tends to eject surface material preferentially in a lateral direction, and this lateral (along a direction somewhat parallel to the surface) sputtering is only weakly dependent on the angle of incidence of the GCIB with the surface. One effect of such sputtering is to remove surface material. Also, because much of the sputtered material has lateral trajectories, there tends to be accelerated erosion of elevated structures on the surface and also to be some redeposition of sputtered surface material in low spots on the surface.

Figure 3A:
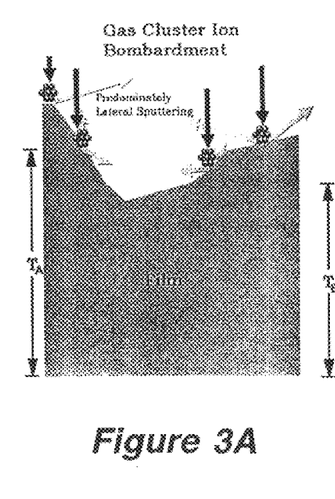
FIGS. 3A, 3B, and 3C are sequential schematic illustrations of three stages (respectively) explaining GCIB surface processing showing three stages of GCIB processing of a thin film by the present invention.
Figure 3B:
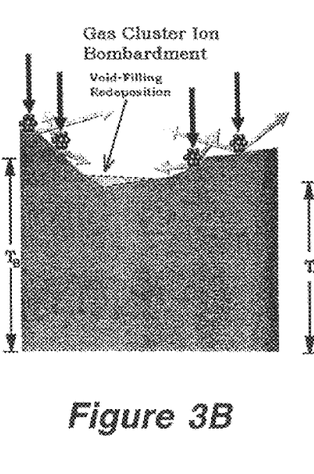
Figure 3C:
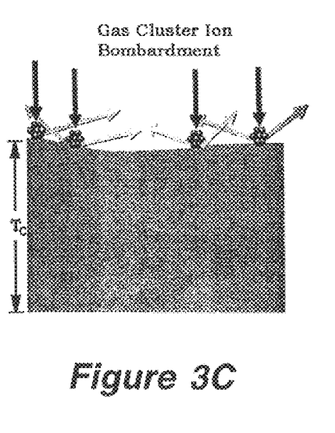

FIGS. 3A, 3B, and 3C schematically show respectively three successive stages of sputtering of a portion of a surface due to bombardment of the surface film by GCIB. In FIG. 3A, the initial stage of bombardment, the unevenness (roughness) of the surface is greatest and the overall thickness ($T_A$) of the film is greatest. As sputtering progresses due to additional GCIB bombardment, the average thickness of the film ($T_B$) decreases and the surface roughness also decreases. Some of the smoothing may result from re-deposition of sputtered material as illustrated schematically in FIG. 3B and some may result from sputtering away of material from the higher portions of the surface. In the final stages, FIG. 3C, the surface becomes very smooth, sometimes approaching smoothness on an atomic or molecular scale. Also the surface becomes thinner and thinner (thickness ($T_C$)) as sputtering continues.

Figure 4:
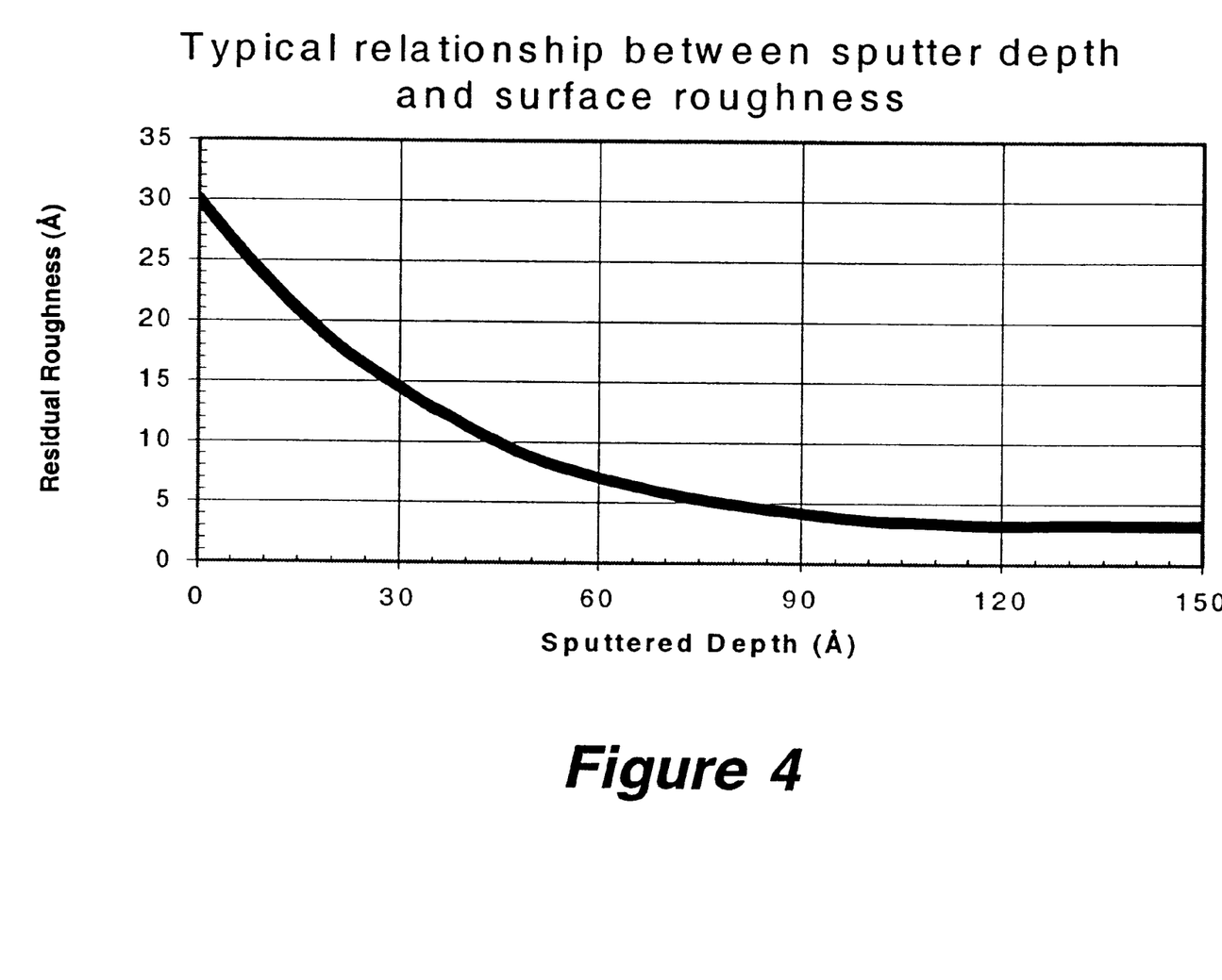
FIG. 4 is a graph showing a typical relationship between GCIB surface smoothing and the amount of sputtering the film undergoes, as occurs with the present invention.

It is apparent from FIGS. 3A through 3C that both thinning (by sputter etching) of the surface film and flattening and smoothing of the surface occur. FIG. 4 is a graph of a typical curve illustrating the fact that the two processes are not independent but rather a combined result of GCIB surface processing. The nature of the relationship between the etching and smoothing that results from the GCIB processing of rough surfaces is different in different situations. The relationship depends on the qualities of the surface being processed, including the material constitution of the surface and the nature of the initial roughness—the spatial frequency and amplitude of the surface roughness, among other factors. It also depends on GCIB parameters including beam energy, gas, and cluster size range. The general nature of the relationship is similar to the curve shown in FIG. 4, namely, a non-linear relationship wherein, during the initial portion of the processing, the roughness improves much more quickly than it does later in the process. Eventually the roughness appears to reach a limit, and then does not significantly improve with additional processing, although continued processing continues to thin the film by sputtering. Although the curve of FIG. 4 is typical for a particular given set of beam parameters and surface material and roughness characteristics, the curve is different for different cases and must be characterized for each case. Such characterization may be done by actual measurement or by mathematical modeling based on previously collected empirical data or by simulation of the physical principles involved, as has been done by Z. Insepov et.al., published in "Sputtering and smoothing of metal surface with energetic gas cluster beams", *Materials Chemistry and Physics*, 54(1–3), July 1998, pp.234–7.

Because both the sputtered depth and the smoothing effect are related to the total accumulated gas cluster ion dose, it is possible to show the relationship between sputter depth and surface roughness according to the data curve of FIG. 4 (or other similar data obtained from measurement or modeling or simulation) as two separate functions of accumulated ion dose.

Figure 5:
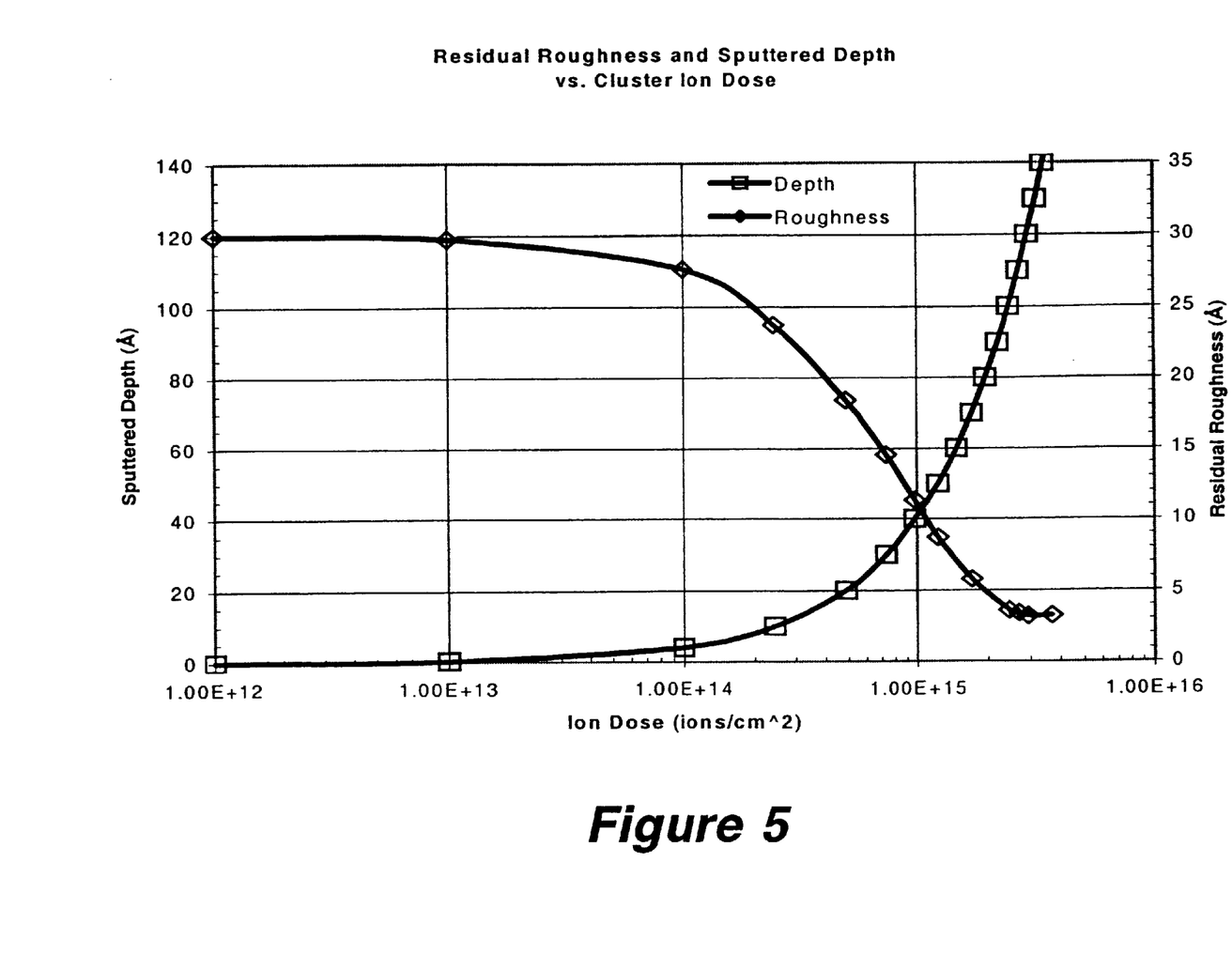
FIG. 5 is a graph showing a typical relationship between GCIB surface smoothing, sputtered depth, and the accumulated gas cluster ion dose, as occurs with the present invention.

FIG. 5 is a graph showing the data from the curve of FIG. 4 separated into two data curves that are shown in their relationship to accumulated ion dose. In this invention this (two separated curves shown as functions of accumulated ion dose) is the preferred way to present the information since, in ion beam processing, ion dose is an easily monitored and controlled independent variable. When presented in this way, it is clear that as ion dose increases, the sputtered depth increases. It is also clear that as ion dose increases, at first the residual roughness decreases, and then the residual roughness approaches a limiting value and does not continue to improve with additional dose. For any particular film of interest having particular starting roughness characteristics and for a particular set of GCIB parameters, data of the type shown in FIG. 5 are easily obtained by the technique of this invention by incrementally exposing the film of interest to increasing ion doses, and measuring the residual roughness and film thinning after each incremental exposure.

Although the available prior art fabrication processes for deposition of films that form the various layers in a magnetic device such as shown for example in FIG. 1 are not generally capable of reliably and repeatedly producing films of the necessary smoothness, the processes are of adequate precision and controllability so as to be able to deposit films of, the desired thickness and with repeatable roughness, on a production basis, when used in conjunction with the present invention. Although additional smoothing is a desired condition for higher performance GMR devices, the thinning that results from GCIB processing is not necessarily desirable. In order to benefit from the superb smoothing that can be obtained by GCIB processing, this invention deals with the related undesired thinning.

Figure 6:
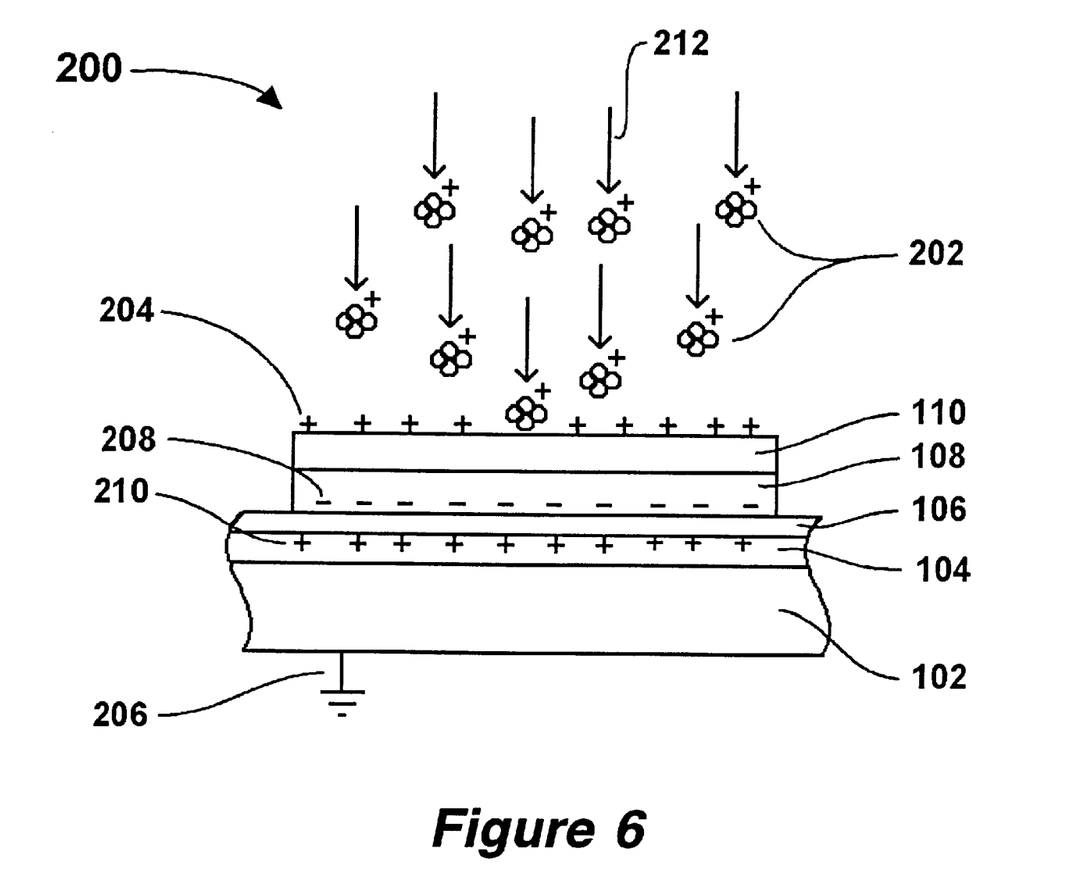
FIG. 6 is a sectional schematic view illustrating how charge transferred to conductive layers of a GMR device during prior art GCIB processing induces electrical stress on any isolation dielectric film fabricated at a lower level.

Another problem that is associated with GCIB processing of conductive films overlaying insulating films and which interferes with the straightforward application of GCIB smoothing is related to the electrical charge that is carried on each gas cluster ion. FIG. 6 (not to scale) schematically illustrates a stage in the fabrication of an SV device 200 of the type shown in FIG. 1 and previously described. In the stage illustrated, initial layers have been fabricated through the level of the pinned magnetoresistive layer 110. A Permalloy pinned magnetoresistive layer 110 is being smoothed (and thinned) by GCIB processing. A bombarding GCIB is directed along direction 212 against the surface of the pinned magnetoresistive layer 110. Individual gas cluster ions 202 have positive electrical charges. Positive charges 204 from the bombarding gas cluster ions transfer to the upper conductive layer. This induces electrical stress in the dielectric isolation layer 106 below due to the induction of opposing negative charges 208 and positive charges 210 in the electrically conductive anti-ferromagnetic layer 108 and the electrically conductive lower shield layer 104. The conductive lower shield layer 104 is grounded through a conductive or semi-conductive substrate 102 and its ground connection 206 or through whatever retaining mechanism may be used to position the substrate in the GCIB for processing. Charge difference building across the isolation layer 106 can stress the dielectric of the isolation layer 106 and may rupture it. GMR devices are also known to be unusually susceptible to permanent damage of the magnetic film by electrostatic discharges that are conducted through the magnetic films (see for example Wallash & Kim, "Magnetic changes in GMR heads caused by electrostatic discharge", *IEEE Trans. Magnetics*, 34(4), July 1998, pp 1519–21 and also Wallash & Kim, "Electrostatic discharge sensitivity of giant magnetoresistive recording heads", *J. Appl. Phys.*, 81(8), April 1997, pp 4921–3). To be certain of high yield production of GMR devices, the present invention avoids the dielectric-stressing and electrical discharge problem illustrated in FIG. 6.

Figure 7:
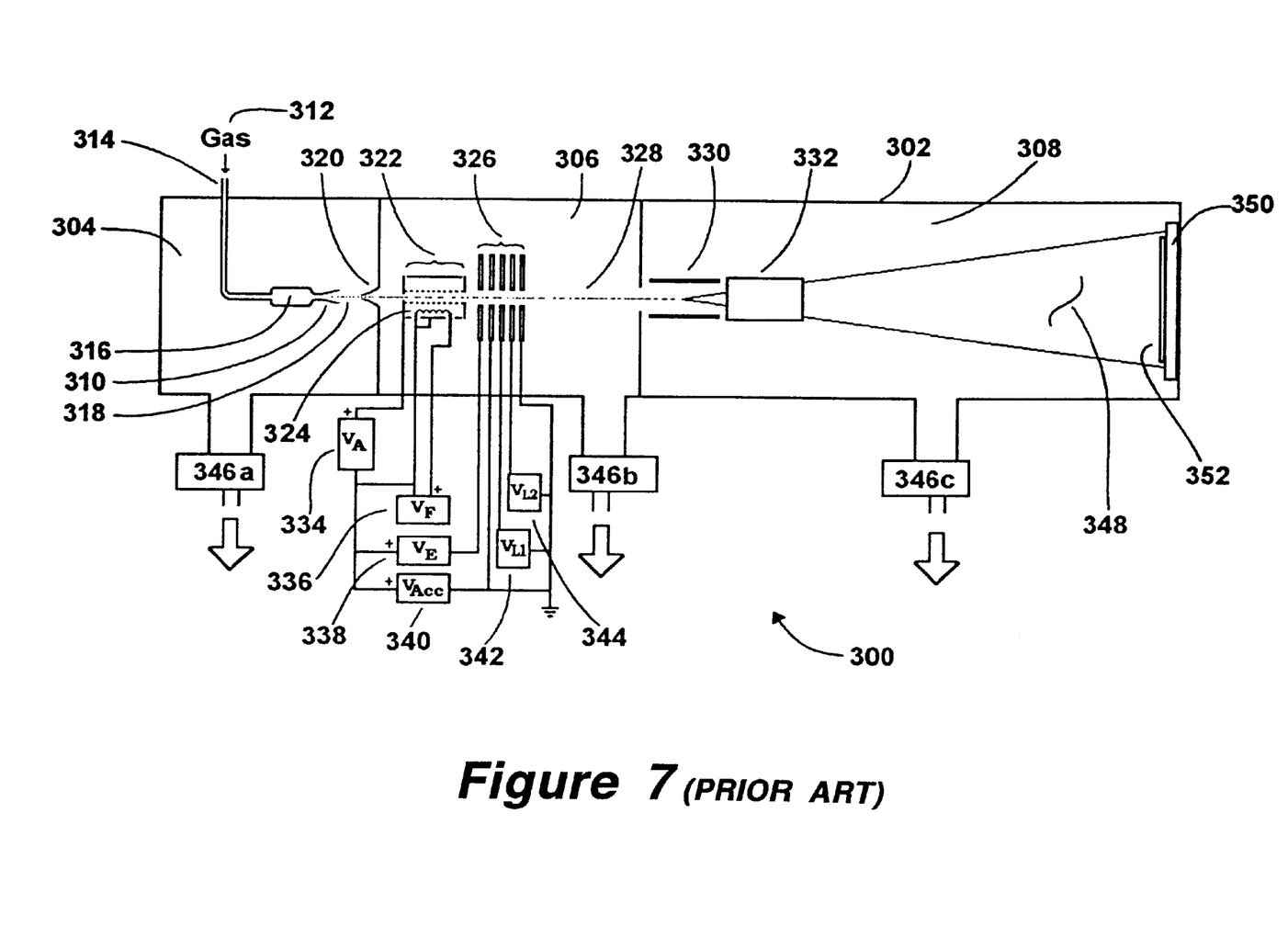
FIG. 7 is a schematic showing the basic elements of a prior art gas cluster ion beam processing system.

FIG. 7 shows a schematic of a typical configuration for a GCIB processor 300 of a form known in prior art, and which may be described as follows. A vacuum vessel 302 is divided into three communicating chambers, a source chamber 304, a ionization/acceleration chamber 306, and a processing chamber 308. The three chambers are evacuated to suitable operating pressures by vacuum pumping systems 346a, 346b, and 346c, respectively. A condensable source gas 312 (for example argon) is admitted under pressure through gas feed tube 314 to stagnation chamber 316 and is ejected into the substantially lower pressure vacuum through a properly shaped nozzle 310. A supersonic gas jet 318 results. Cooling, which results from the expansion in the jet, causes a portion of the gas jet 318 to condense into clusters, each consisting of from several to several thousand weakly bound atoms or molecules. A gas skimmer aperture 320 separates the gas products that have not been formed into a cluster jet from the cluster jet so as to minimize pressure in the downstream regions where such higher pressures would be detrimental (e.g., ionizer 322, high voltage electrodes 326, and process chamber 308). Suitable condensable source gases 312 include, but are not necessarily limited to argon, nitrogen, and other gases.

After the supersonic gas jet 318 containing gas clusters has been formed, the clusters are ionized in an ionizer 322. The ionizer 322 is typically an electron impact ionizer that produces thermoelectrons from one or more incandescent filaments 324 and accelerates and directs the electrons causing them to collide with the gas clusters in the gas jet 318, where the jet passes through the ionizer 322. The electron impact ejects electrons from the clusters, causing a portion the clusters to become positively ionized. A set of suitably biased high voltage electrodes 326 extracts the cluster ions from the ionizer, forming a beam, then accelerates them to a desired energy (typically from 1 keV to several tens of keV) and focuses them to form a GCIB 328. Filament power supply 336 provides voltage $V_F$ to heat the ionizer filament 324. Anode power supply 334 provides voltage $V_A$ to accelerate thermoelectrons emitted from filament 324 to cause them to bombard the cluster containing gas jet 318 to produce ions. Extraction power supply 338 provides voltage $V_E$ to bias a high voltage electrode to extract ions from the ionizing region of ionizer 322 and to form a GCIB 328. Accelerator power supply 340 provides voltage $V_{ACC}$ to bias a high voltage electrode with respect to the ionizer 322 so as to result in a total GCIB acceleration energy equal to $V_{ACC}$ One or more lens power supplies (342 and 344 shown for example) may be provided to bias high voltage electrodes with potentials ($V_{L1}$ and $V_{L2}$ for example) to focus the GCIB 328.

A workpiece 352 is held on a workpiece holder 350, disposed in the path of the GCIB 328. since many applications require the processing of large size substrates with spatially uniform results, a scanning system is desirable to uniformly scan the GCIB 328 across large areas to produce spatially homogeneous results. Two pairs of orthogonally oriented electrostatic scan plates 330 and 332 can be utilized to produce a raster or other scanning pattern across the desired processing area. When beam scanning is performed, the GCIB 328 is converted into a conical scanned GCIB 348, which scans the entire surface of workpiece 352. An alternative method for uniform processing of the workpiece (not illustrated in FIG. 7) is to leave the GCIB 348 unscanned, while a mechanical x-y scanning system is employed to scan the workpiece through the stationary beam.

Not shown in FIG. 7, but also sometimes utilized, is a mass selector for selecting clusters of a certain mass or within a certain range of masses. Such mass selector can be, for example, a weak transverse magnetic field in the path of the GCIB 328 for deflecting monomer ions and other light ions (such as those cluster ions of ten or fewer atoms or molecules) out of the beam and passing more massive cluster ions.

An important consideration taken into account with the present invention in the ion beam processing of conductive films on insulating surfaces or on surfaces covered by insulating films (as is the when GMR devices are fabricated) is the tendency for the gas cluster ion beam to induce charging of the films being processed (smoothed and thinned, in this case). If sufficient charge is permitted to accumulate without means for dissipation, the insulating film or the magnetic devices may be damaged. The dielectric properties of the film may be exceeded and the film can be ruptured or otherwise permanently damaged by the electrical stress. The magnetic properties of the magnetic films may also be modified. This charging problem is well known in ion beam processing. In the prior art system of FIG. 7, there is no provision for avoiding the undesirable charging effects induced by the charged gas cluster ion beam. However, in the present invention, means for limiting the charging of conductive films on insulating surfaces during GCIB smoothing is provided to avoid undesirable and harmful charging. When the positive cluster ions strike the insulating film, they may transfer their charge to the film. The collision process also results in the liberation of secondary particles from the surface—surface atoms thus liberated result in the etching of the surface. The liberated secondary particles may be electrons, neutral atoms, or charged atoms. Free electrons are much more mobile than free charged atoms (ions) and are likely to escape. Thus, the main tendency of the release of secondary particles is to increase the positive charging of the surface. The present invention minimizes these effects by preventing the escape of liberated charged particles and by eliminating the harmful charging effects of the positive charges in the GCIB.

Figure 8:
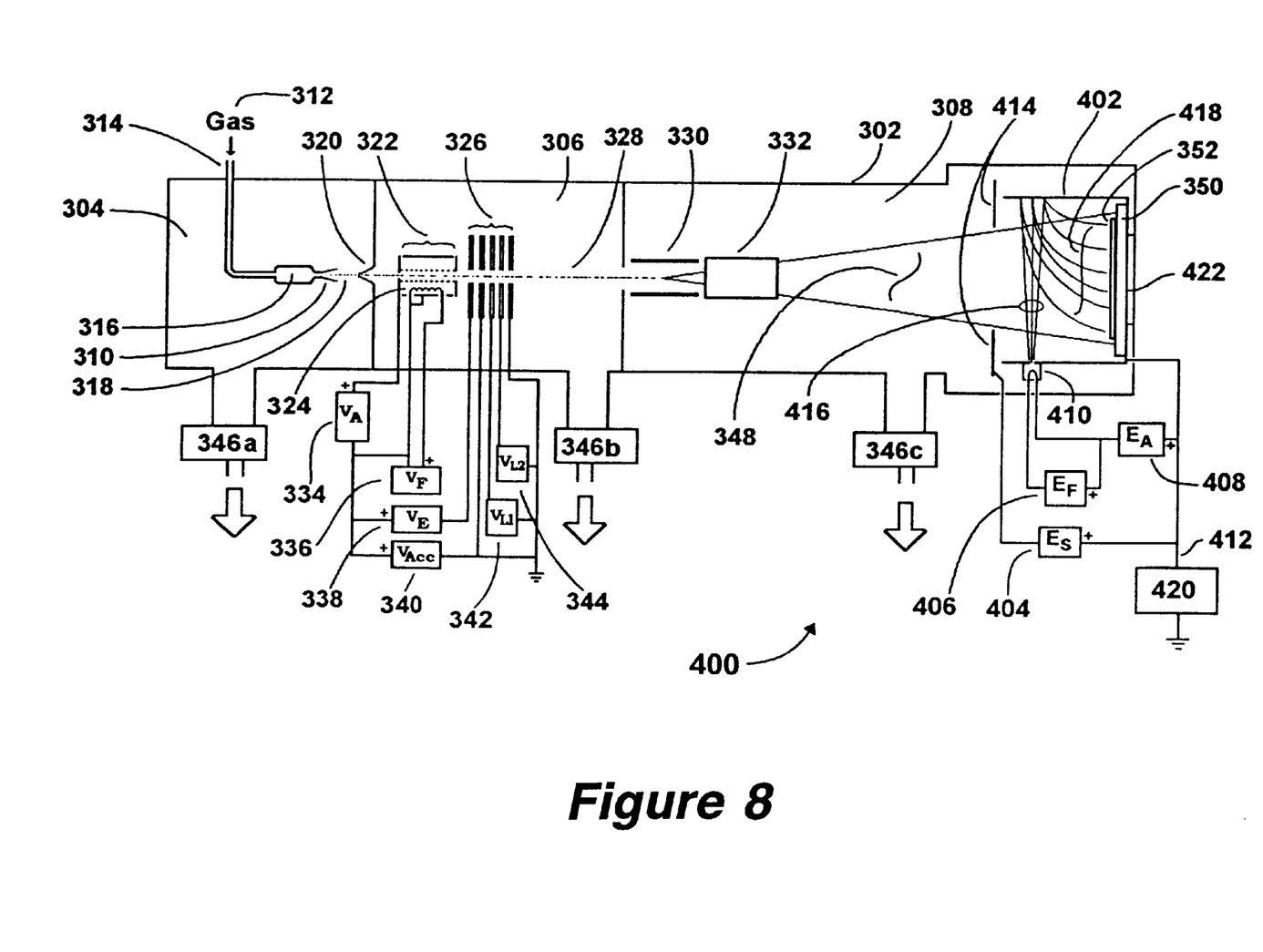
FIG. 8 is a schematic showing the improved gas cluster ion beam processing system of the invention for smoothing conductive films on electrically insulating films or substrates without damage due to charging.

In order to eliminate the positive charging of conductive films during positive ion beam processing, the present invention provides a source of excess electrons to the surface so that they may continuously neutralize the surface to prevent accumulation of a harmful charge. This may be accomplished in a number of different ways. A source of thermoelectrons (e.g. a filament) may be placed in the vicinity of the target. An accelerated source of electrons (an electron gun) may be directed at the target (examples are shown by Hanai in Japanese laid open application JP-60215760-A1 and by Yamanishi in Japanese laid open application JP-61247036-A1). A source of low energy secondary electrons generated from collision of an accelerated beam of electrons with a surface in the vicinity of the target may be used as shown in FIG. 8. A plasma bridge source of low energy electrons may be conveyed to the target by a neutral plasma in the target area. Without such measures, damage from charging is likely to result in such negative consequences that the otherwise useful and novel process might be severely impaired in usefulness.

FIG. 8 shows the GCIB processing system 400 of this invention for smoothing of conductive films on insulating films or substrates including improvements beyond the prior art to minimize the undesirable effects of charging due to the use of charged cluster ions as the smoothing means, thus minimizing damage to the dielectric isolation layer, while enjoying the beneficial smoothing effects of GCIB processing. In this example one of several possible methods of providing neutralizing electrons is illustrated for example. The substrate processing region is surrounded with a Faraday enclosure 402 attached to the vacuum vessel 302 with an electrically insulating mount 422. The Faraday enclosure 402 has a suppressor ring electrode 414 at the beam entrance opening of the Faraday enclosure 402. The suppressor ring electrode 414 is negatively biased with respect to the Faraday enclosure 402 by suppressor power supply 404 providing suppressor bias voltage $E_S$ so as to permit entrance of the scanned GCIB 348 with minimal influence, but yet also prevent the exit of electrons, retaining all secondary electrons in the Faraday enclosure where they may be returned to the workpiece 352. Additionally, an active electron gun 410 powered by filament power supply 406, providing filament bias voltage, $E_F$, and by anode power supply 408, providing anode bias voltage, $E_A$, is attached to the side-wall of the Faraday enclosure 402. The electron gun 410 is configured and biased to project a beam of primary electrons 416 to the opposite wall of the Faraday enclosure 402. The beam of primary electrons 416 induces the emission of low energy secondary electrons 418 from the Faraday enclosure wall. These low energy secondary electrons 418 may flow to the workpiece 352 as required to minimize positive charging due to arrival of the positive cluster ions in the scanned GCIB 348. In most cases it may be desirable to control the amount of smoothing (and thinning) that occurs by measuring the total quantity of positive gas cluster ions that strike the workpiece 352. In such a case, a lead 412 from the Faraday enclosure 402 conducts charge to an integrator 420 that integrates the charge to provide an indication of GCIB smoothing progress.

Figure 9:
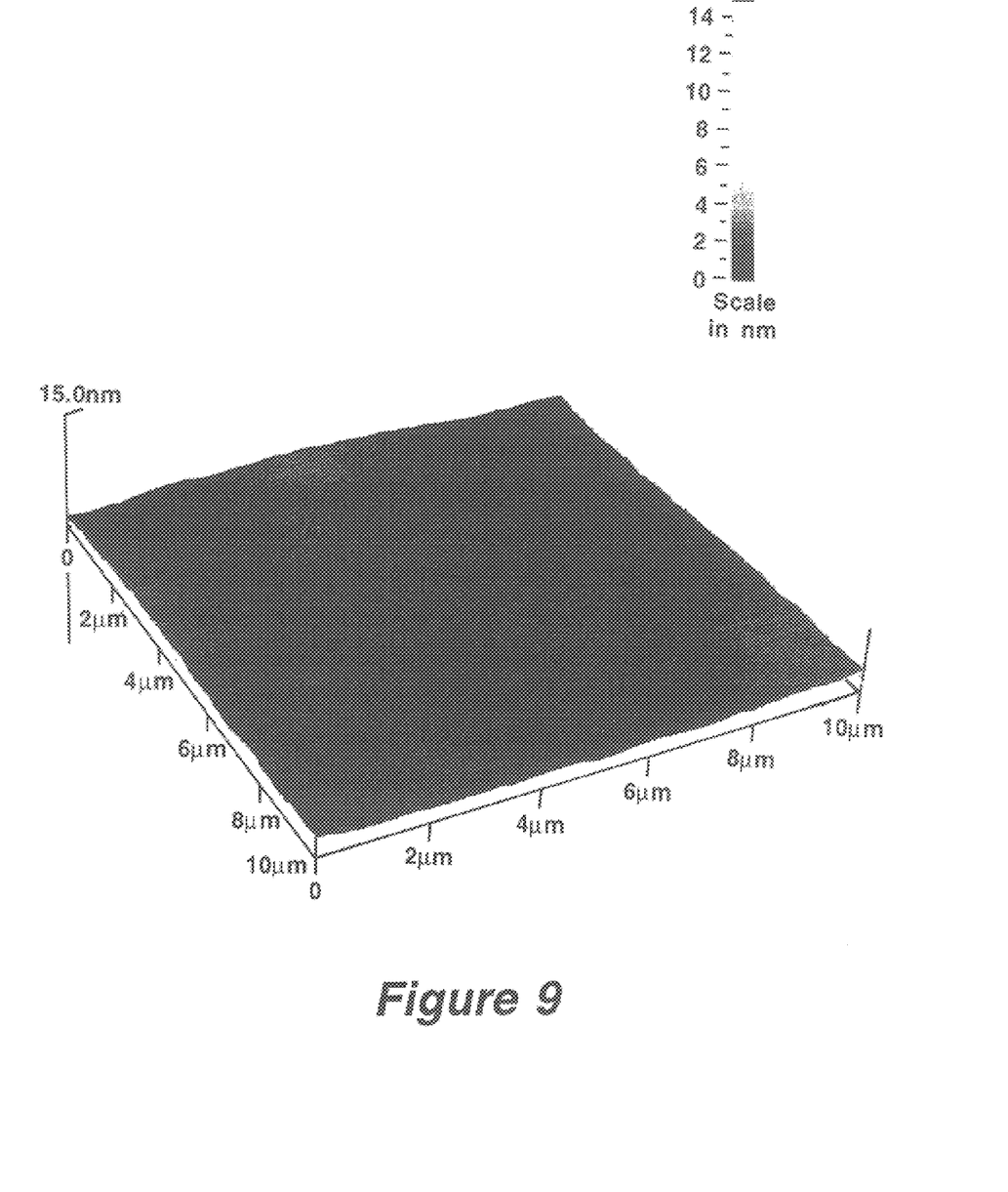
FIG. 9 is an atomic force micrograph of a gas cluster ion beam smoothed Permalloy surface according to the method of the invention.

The apparatus of the invention described above can be employed in order to use GCIB to smooth Permalloy or like films on insulating surfaces with results superior to those obtained by CMP processing and without damage to the films due to charging effects. FIG. 9 is an atomic force micrograph of a 10 microns square region of the surface of such a film. It is free of scratches and the surface roughness is characterized by an improved $R_a$ of approximately 3.0 Angstroms, and an improved $R_{rms}$ of approximately 3.9 Angstroms. This is superior smoothness as compared with the conventionally smoothed film shown in FIG. 2 and discussed previously.

Because such GCIB smoothing process removes material, thinning a Permalloy film or a like film, it is desirable that the initial film be thicker than the desired final thickness. Then as the film surface is smoothed, material is removed, reducing the thickness to the desired final film thickness. By first selecting a set of GCIB parameters including gas, range of cluster sizes, beam energy and beam current, the smoothing/thinning process with such beam conditions can be characterized either by mathematical modeling or by incrementally exposing the film to increasing ion cluster beam doses and measuring the residual roughness and film thinning after each exposure increment. The characterization data may be in the form of mathematical equations or models or may be presented graphically after the fashion shown in FIG. 5.

From the characterization data, the total dose necessary to provide the desired smoothing is first determined, either mathematically or by graphical construction. Next, the amount of thinning resulting from the predetermined dose is determined, either mathematically or by graphical construction. Having thus determined the amount of thinning that will occur, an initial film can be deposited of thickness equal to the desired final thickness plus the amount that will be removed by GCIB processing. Then during actual processing, the initially over-thick film is smoothed to the desired smoothness and thinned to the desired final thickness. The predetermined dose necessary to provide the desired smoothness and thickness can be monitored and controlled by the dosimetry integrator, which measures the beam charge accumulated in the Faraday cup.

An illustrative example of the process of this invention is described using the apparatus of FIG. 8, assuming that a Permalloy film is to be smoothed to an average roughness not greater than 4 Angstroms and that the desired final thickness of the smooth Permalloy film is 10 nm (100 Angstroms). A gas cluster ion beam of argon clusters having clusters in the size range of 10 to 5000 atoms, an energy of 10 keV, and other predetermined parameters will be used. The type of Permalloy film to be smoothed has been deposited on a substrate by a standard deposition process which is repeatable, can deposit a specified film thickness, and produces a film having an average roughness of 30 Angstroms with repeatable roughness feature size. The effect of the above specified GCIB on the Permalloy film has been previously characterized and has the etching and smoothing characteristics shown in FIG. 5.

Figure 10:
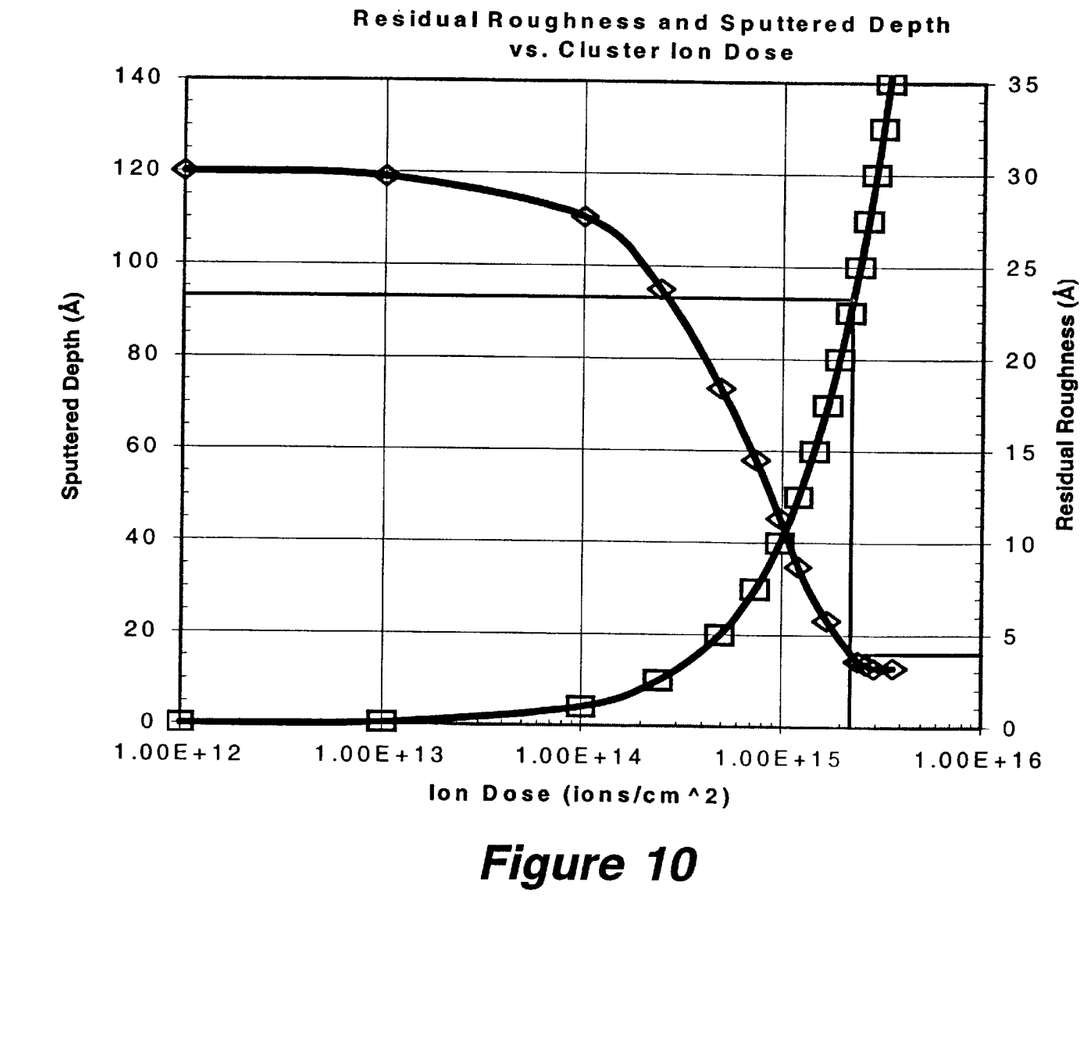
FIG. 10 is a graph for illustrating the method of the invention of determining a necessary ion dose and starting film thickness for obtaining a final film of desired thickness and smoothness.

FIG. 10 illustrates the process, using the characterization data from FIG. 5. By extending a horizontal line from the 4 Angstroms ordinate on the Residual Roughness axis until it intersects the Residual Roughness curve, we see that $2.25 \times 10^{15}$ (2.25E15) Ion Dose is required to reduce the initial 30 Angstroms average roughness to 4 Angstroms. Extending a vertical line from the $2.25 \times 10^{15}$ abscissa on the Ion Dose axis until it intersects the Depth curve, we see that 93 Angstroms of Permalloy will be sputtered away during the process of achieving 4 Angstroms smoothness. This process predetermines that the necessary ion dose of the specified GCIB is $2.25 \times 10^{15}$ ions/cm$^2$. It also determines that 93 Angstroms of the film will be sputtered away. Since the desired final thickness of the smooth film is 100 Angstroms, the starting film thickness should be 100+93=193 Angstroms. When the Permalloy film deposition process is set up to provide a 193 Angstroms thick film of Permalloy having a starting roughness of 30 Angstroms and when the resulting film is processed with the specified GCIB to an ion dose of $2.25 \times 10^{15}$ ions/cm$^2$, the resulting film will be 100 Angstroms thick with a average residual roughness of 4 Angstroms.

Although the invention has been described with respect to various embodiments, it should be realized this invention is also capable of a wide variety of further and other embodiments within the spirit and scope of the appended claims.

What is claimed is:

1. Apparatus for processing a workpiece comprising a multiple layer substrate by gas cluster ion beam bombardment, comprising:
    a vacuum chamber in which the workpiece is to be located;
    means for holding the workpiece is said vacuum chamber for processing;
    means for forming a gas cluster ion beam;
    means for directing said gas cluster ion beam onto a surface of the workpiece; and
    means for neutralizing said surface of the workpiece,
    wherein said multi-layer substrate includes at least one electrically insulating layer and at least one electrically conductive film or films, and
    further wherein said at least one electrically conductive film or films is a surface layer.

2. The apparatus of claim 1, wherein said neutralizing means comprises a source of electrons.

3. The apparatus of claim 1, wherein said neutralizing means comprises a source of secondary electrons.

4. The apparatus of claim 1, wherein said directing means comprises a means for moving said workpiece relative to the gas cluster ion beam.

5. Apparatus for processing a workpiece comprising a multiple layer substrate by gas cluster ion beam bombardment, comprising:
    a vacuum chamber in which the workpiece is to be located;
    means for holding the workpiece in said vacuum chamber for processing;
    means for forming a gas cluster ion beam;
    means for directing said gas cluster ion beam onto a surface of the workpiece; and
    means for neutralizing said surface of the workpiece,
    wherein said directing means comprises means for scanning said gas cluster ion beam relative to the workpiece.

6. Apparatus for processing a workpiece by gas cluster ion beam bombardment, comprising:
    a vacuum chamber in which the workpiece is to be located;
    means for holding the workpiece in said vacuum chamber for processing;
    means for forming a gas cluster ion beam;
    means for scanning said gas cluster ion beam relative to a surface of the workpiece;
    means for measuring an accumulated gas cluster ion dose; and
    means for neutralizing said surface of the workpiece.

7. The apparatus of claim 6, wherein said workpiece comprises a substrate comprising:
    at least one electrically insulating layer; and
    at least one electrically conductive film, said at least one electrically conductive film being a surface layer.

8. The apparatus of claim 6, wherein said scanning means comprises a means for moving said workpiece relative to the gas cluster ion beam.

9. The apparatus of claim 6, wherein said neutralizing means comprises a source of electrons.

10. The apparatus of claim 6, wherein said neutralizing means comprises a source of secondary electrons.

11. The apparatus of claim 6, wherein said measuring means comprises:
    current collection means for collecting an electrical current proportional to a gas cluster ion beam current of said gas cluster ion beam; and
    integrating means for integrating said electrical current to determine an accumulated gas cluster ion dose.

12. The apparatus of claim 11, wherein said current collection means comprises a Faraday enclosure.

13. The apparatus of claim 11, wherein said measuring means further comprises process control means to terminate gas cluster ion beam processing upon accumulation of a desired gas cluster ion dose.

14. A method of producing a smooth conductive film on an insulating film or on an insulating substrate by using a gas cluster ion beam, comprising the steps of:
    selecting a conductive film;
    selecting beam parameters for a gas cluster ion beam;
    characterizing the smoothing and thinning characteristics for said selected conductive film, by a gas cluster ion beam having said selected beam parameters;
    establishing a desired degree of smoothness for the selected conductive film;
    determining a dose of gas cluster ions of said selected beam parameters for providing a desired degree of smoothing on the selected conductive film;
    determining the amount of thinning that results to said selected conductive film when it receives said determined dose of gas cluster ions;
    depositing said selected conductive film on said insulating film or said insulating substrate, said deposited conductive film having a thickness in excess of a desired final thickness by an amount equal to said determined amount of thinning;
    directing the gas cluster ion beam upon said deposited film until said determined dose has been delivered; and
    providing a source of electrons during delivery of said gas cluster ion dose to prevent undesirable charging of said deposited film.

15. The method claim 14, wherein said deposited conductive film is a magnetic material.

16. The method of claim 14, wherein the deposited conductive film is a magnetic film for forming a pinned or free magnetoresistive layer.

17. The method claim 14, wherein the deposited conductive film is a nonmagnetic metal.

18. The method claim 17, wherein said nonmagnetic metal is for forming an interface between two magnetoresistive layers.

19. The method of claim 14, wherein the deposited conductive film forms part of a GMR magnetic device.

20. The method of claim 14, wherein the deposited conductive film forms part of a spin valve.

21. The method claim 14, wherein the deposited film is a film that will underlay a magnetoresistive device.

22. A method of producing a smooth thin film on an insulating film or on an insulating substrate by using a gas cluster ion beam, comprising the steps of:

selecting a thin film material;

selecting beam parameters for a gas cluster ion beam;

characterizing the smoothing and thinning characteristics for said selected thin film material, by a gas cluster ion beam having said selected beam parameters;

establishing a desired degree of smoothness for the selected thin film material;

determining a dose of gas cluster ions of said selected beam parameters for providing a desired degree of smoothing on the selected thin film material;

determining the amount of thinning that results to said selected thin film material when it receives said determined dose of gas cluster ions;

depositing said selected thin film material on said insulating film or said insulating substrate, said deposited tin film having a thickness in excess of a desired final thickness by an amount equal to said determined amount of thinning;

directing the gas cluster ion beam upon said deposited thin film until said determined dose has been delivered; and providing a source of electrons during delivery of said gas cluster ion dose to prevent undesirable charging of said deposited thin film.

* * * * *